June 21, 1966 R. G. CALLAHAN 3,257,622

STABLE HIGH GAIN DIRECT COUPLED AMPLIFIER EMPLOYING
STARVATION CIRCUIT TECHNIQUES

Filed Sept. 9, 1963

United States Patent Office
3,257,622
Patented June 21, 1966

3,257,622

STABLE HIGH GAIN DIRECT COUPLED AMPLIFIER EMPLOYING STARVATION CIRCUIT TECHNIQUES

Raymond G. Callahan, Manchester, Mass., assignor, by mesne assignments, to Electron Dynamics, Inc., Manchester, Mass., a corporation of Massachusetts Filed Sept. 9, 1963, Ser. No. 307,456
6 Claims. (Cl. 330—128)

Figure 3:
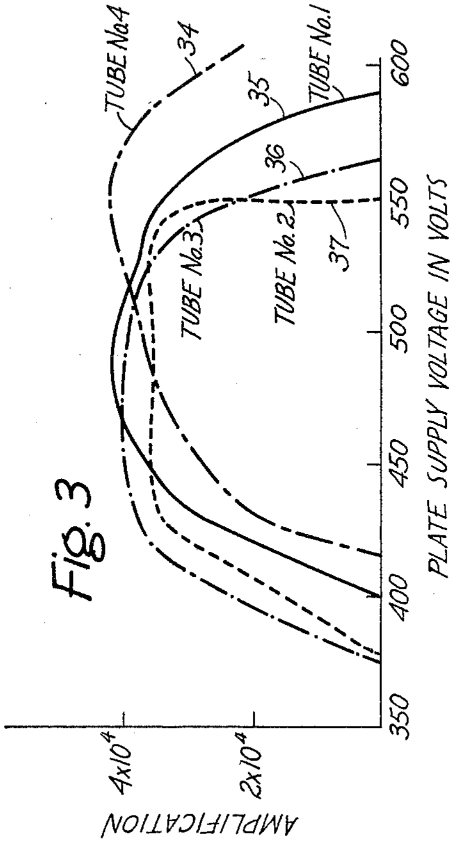

This invention relates to high gain direct coupled amplifiers. In particular, there are comprehended novel improvements in amplifiers employing so-called starvation circuits, which improvements eliminate the need for critical circuit components and provide gain stability over a wide range of plate supply voltage fluctuation.

The use of a starvation circuit to greatly increase the gain of a vacuum tube amplifier stage is a well known technique in the electronics art. Amplifier tube current starvation is accomplished by operation at reduced heater voltage, by operation beyond the knee of the tube transfer curve, or by operation with low screen voltage in a pentode. The latter method is by far the most reliable and it is toward the improvement of amplifiers utilizing this method of operation that the present invention is directed.

In general, such a technique comprises lowering the screen voltage of a pentode to a value that is less than ten percent of the plate supply voltage while increasing the plate resistance by approximately an order of magnitude. The plate current is thus drastically reduced causing the tube to operate in a "starved" manner.

It would appear that the increased gain obtained from this method of operation would permit the omission of amplification stages and a concomitant reduction in manufacturing costs. However, the very high gain associated with prior art starvation amplifiers is obtained only when the reduced screen grid voltage is maintained in a certain fixed relationship to the plate supply voltage. Thus, if the screen grid bias is fixed and the plate supply voltage fluctuates over a ten percent range (as is the case with economically feasible commercially available power supplies) high gain may be achieved only intermittently. This inherent instability makes tube selection and replacement a serious problem and has in the past limited the practicability of these devices. That is, the substitution of an expensive stable power supply as a means for providing reliable starvation amplifier operation obviates the economics obtained from the omission of amplifier stages. Also, although a chopper stabilized amplifier may be used, the increased expense, together with a reduced upper frequency response limit makes such an arrangement less attractive than the amplifier described in this invention. Another prior art approach to the problem of stabilizing starvation amplifier circuits has been to provide a feedback circuit from the output tube cathode circuit to the pentode screen grid whereby the grid bias follows plate supply voltage fluctuations. Such a feedback circuit, however, includes a resistor between the cathode of the output tube and ground, which, if not by-passed by a capacitor, greatly reduces overall amplifier gain. If the feedback circuit includes such a capacitor, application of the amplifier is limited to alternating current operation.

It is therefore a principal object of this invention to provide a new and improved direct coupled amplifier employing starvation circuit techniques.

It is another object of the invention to provide a direct coupled amplifier employing starvation circuit techniques that is operable at frequencies ranging from direct current to kilocycles.

Another object of the invention is to provide a direct coupled amplifier employing starvation circuit techniques that has gain stability over a wide range of plate supply voltage fluctuation.

Another object of the invention is to provide an economically feasible method of stabilizing a direct coupled, direct current starvation amplifier circuit.

Another object of the invention is to provide a direct coupled amplifier employing starvation circuit techniques that does not require critical circuit components.

Figure 4:
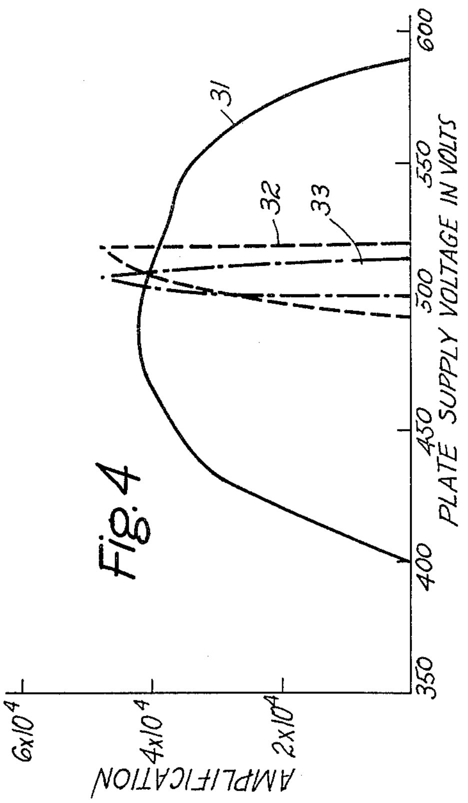
Figure 1:
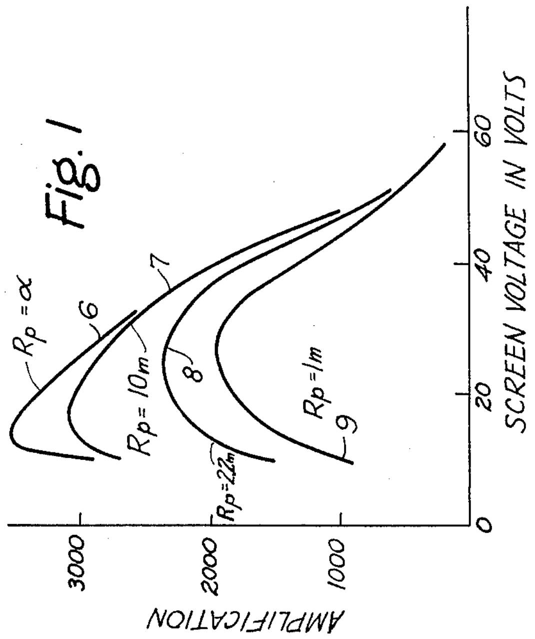
Figure 2:
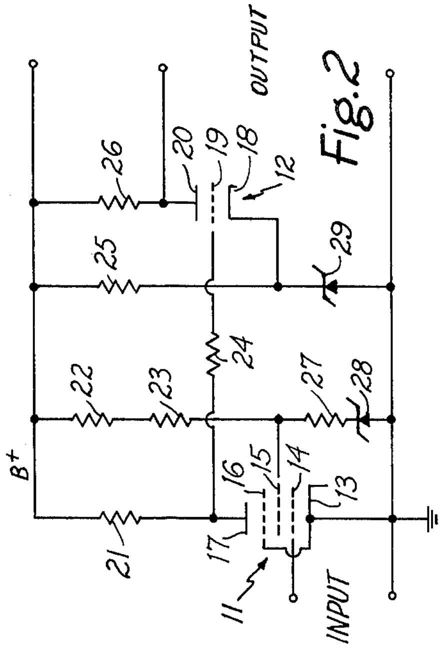

These, together with other objects and features of the invention, will become more readily apparent from the following detailed description taken in conjunction with the accompanying drawing wherein:

FIGURE 1 presents curves for a typical pentode illustrating amplification against screen grid voltage for various values of plate resistance;

FIGURE 2 is a schematic diagram of a direct coupled amplifier starvation circuit employing the principles of this invention;

FIGURE 3 presents curves illustrating the amplification of various tubes for a range of plate supply voltage fluctuation; and FIGURE 4 presents the amplification versus plate supply voltage curves of direct coupled amplifiers employing various screen grid divider arrangements.

Starvation amplifiers of the type comprehended by this invention generally comprise a pentode having its output directly coupled to the control grid of a triode. The very high gain is achieved through the "starved" condition of the pentode. Since published curves which extend into the starvation region are not available for most commercial tubes, it usually is necessary to plot amplification against screen voltage for various values of plate resistance for the pentode to be used. In the illustrative example of the present invention hereinafter presented, a 6AW8–A pentode-triode made by Radio Corporation of America was employed. Optimum plate resistance and screen voltage values were determined by setting the pentode up as an amplifier with a fixed plate supply voltage and varying the plate resistance between one and twenty megohms and the screen grid voltage between zero and forty volts. Curves 6, 7, 8 and 9 of FIGURE 1 illustrate the amplification of this tube at various screen grid voltages for four different values of plate resistance. It is apparent from these curves that the amplification factor is maximized for an infinite plate resistance and at a screen gridvoltage of approximately fourteen volts and then is decreased sharply as the pentode becomes "over-starved" by further reduction of screen grid voltage. However, with a plate resistance of 2.2 megohms and a screen grid voltage of twenty-five volts, the tube may be operated on the stable side of a fairly broad peak and at an accptably high amplification level. These values, then, were selected as being optimum from the standpoint of stability of operation at maximum amplification.

Stability of operation, as discussed above, is required to provide a practicable starvation amplifier. It should be noted that the relatively stable condition represented by the fairly broad peak of the 2.2 megohm curve of FIGURE 1 is achieved only as long as the plate supply voltage is maintained at a constant value. Curve 32 of FIGURE 4, which is characteristic of prior art starvation amplifiers having resistive screen grid curves, illustrates how sharply the amplification falls off with a small fluctuation of plate supply voltage. In most cases, a power supply capable of maintaining plate supply voltage within the narrow limits of curve 32 would be prohibitively expensive.

In accordance with the principles of the present invention, however, means for accomplishing stable operation for a starvation amplifier have been discovered which do not require such exacting control of the power supply voltage. In particular, it has been determined that stable operation can be achieved if the screen grid bias is maintained in a certain relationship to the plate supply voltage. The method of determining this relationship and the means for maintaining it over a wide range of plate supply voltage fluctuation comprise the essence of the invention, such method and means being hereinafter described in detail with reference to FIGURE 2.

Having particular reference now to FIGURE 2, a pentode 11, such as the pentode section of the 6AW8–A pentode-triode referred to above, is provided in the starvation amplifier circuit with the cathode 13 connected to ground and the anode 17 connected to the B+ plate supply through plate resistor 21. The suppressor grid 16 of pentode 11 is tied to the cathode 13 and screen grid 15 is connected to a screen grid divider comprising resistors 22, 23, 27 and zener diode 28. The input signal to be amplified is applied to control grid 14. The output of pentode 11 is applied to the control grid 19 of triode 12 through isolation resistor 24. The cathode 18 of triode 12 is connected to the potential source provided by zener diode 29 and dropping resistor 25 and the anode 20 is connected to B+ plate supply through plate resistor 26.

As an example of the design of such an amplifier, pentode 11 and triode 12 were selected to be the respective sections of a 6AW8–A pentode-triode tube. Such a tube is desirable because of its high plate resistance and transconductance characteristics. The pentode section 11 was evaluated in the manner described above to determine optimum values for plate resistor 21 (2.2 megohms) and screen grid bias (approximately twenty-five volts). The amplifier was then completed by connecting the triode half of the tube to the pentode half allowing for a two or three volt triode bias. The zener diode 29 was included in the triode cathode circuit in order to provide a non-degenerative path to ground for frequencies ranging from direct current to frequencies above the upper frequency limit of the amplifier. A 110 volt IN3045B zener diode was used in this instance since the difference between the voltage on the diode and the quiescent pentode plate voltage (107 volts) would provide the desired triode grid bias. Dropping resistor 25 was determined to be 240,000 ohms to keep within the current range of zener diode 29 and resistor 26 determined to be 200,000 ohms in accordance with the requirements of triode 12.

Stabilization of the circuit against power supply and tube changes was then achieved in accordance with one of the novel features of the invention by providing the proper combination of resistors together with a zener diode in the pentode screen grid divider. It has been determined that a specific voltage gradient, which is fixed for a given tube type, must be maintained on the pentode screen grid for a shift in the plate supply voltage in order to maintain a fixed operating point for the triode. In order to achieve the desired voltage gradient it was discovered that a combination of fixed voltage, such as would be provided by a zener diode, and a variable voltage such as would be developed across a resistor must be provided between the screen grid and the cathode of pentode 11. The desired voltage gradient for a given tube type is represented by the equation:

$$\text{Voltage gradient} = \frac{\Delta E_{\text{screen}}}{\Delta E_{\text{plate supply}}} \qquad (1)$$

This gradient was determined in the present example by varying the plate supply voltage while simultaneously adjusting the screen voltage for maximum amplifier gain. A potentiometer was used to vary the screen grid voltage. The resistor values of the screen grid divider are related to the voltage gradient in accordance with the equation:

$$\text{Voltage gradient} = \frac{R_2}{R_1 + R_2} \qquad (2)$$

where $R_1$ = the resistance between the screen grid and the plate supply voltage source (resistors 22 and 23 of FIGURE 2), and $R_2$ = the resistance between the screen grid and the zener diode (resistor 27 of FIGURE 2).

Having thus obtained the voltage gradient for the tube, the values for $R_1$ and $R_2$ were determined from Equation 2 to be 220,000 ohms and 3300 ohms respectively. In order to achieve temperature stabilization, the resistors were selected to have power ratings for equal watts per volt requiring that $R_1$ comprise two series-connected 110,000 ohm resistors as shown in FIGURE 2. Diode 28 was selected as an IN967B zener diode. The voltage on this zener diode was then equal to the screen voltage minus the voltage drop across resistor 27, both being at the median valve of the plate supply voltage variation.

Referring now to FIGURE 4, curve 31 represents the amplification versus plate supply voltage characteristic of the starvation amplifier hereinabove described. Curves 32 and 33 represent the same characteristics wherein purely resistive and purely zener diode components respectively have been substituted for the novel screen grid divider of the invention. It is apparent from an examination of these curves that starvation amplifiers employing the principles of the present invention exhibit marked improvement in stability.

Referring now to FIGURE 3, curves 34, 35, 36, and 37 represent the amplification versus plate supply voltage characteristics of the starvation amplifier hereinabove described using various tubes. It can be seen from FIGURE 3 that stable operation in the vicinity of the median 500 volt plate supply voltage is achieved regardless of tube substitution.

Although amplifiers of the type described herein find wide application in the electronic art, they are particularly adaptable as means for regulating power supplies whereby the higher gain obtained results in improved regulation. Since, in such an application, the amplifier comprises part of a closed loop circuit, it is not required that the output be a faithful reproduction of the input. However, amplifiers employing the principles of this invention also find great utility in instrumentation and medical applications where an indicator is driven directly by the amplifier and no closed loop or feedback circuit is involved. In such cases it is of paramount importance that the screen grid bias gradient be precisely maintained. This is accomplished in the present invention by simply substituting a variable resistor for the fixed resistor 27 and adjusting it so that the amplifier output remains constant for a constant input over the range of plate supply voltage fluctuation.

Having thus disclosed the invention and an illustrative embodiment thereof it is to be understood that although specific terms are employed, they are used in a generic and descriptive sense, and not for the purposes of limitation, the scope of the invention being set forth in the following claims.

What is claimed is:

1. The combination of a starved current amplifier and stabilizing means for stabilizing the gain thereof for fluctuations in plate supply voltage, said starved current amplifier including a pentode having a control grid for receiving an input signal and a screen grid, and said stabilizing means comprising a voltage dividing circuit connected to the screen grid of said pentode, said voltage dividing circuit comprising a first resistance means connected between said screen grid and the plate supply voltage source, a constant voltage source, and a second resistance means, said second resistance means being connected between said screen grid and said constant voltage source, said pentode having a gain stability voltage gradient characteristic represented by $$\frac{\Delta E_{\text{screen}}}{\Delta E_{\text{plate supply}}}$$

at substantially maximum gain, and said first and second resistance means having relative values adapted to establish a screen grid bias voltage that is consistent with said gain stability voltage gradient characteristic.

2. A direct coupled amplifier comprising a pentode amplifier tube input stage, a triode tube output stage, means for connecting the anode of said pentode amplifier tube to the control grid of said triode tube, a zener diode connected between the cathode of said triode tube and ground, first resistance means connected between the plate of said pentode amplifier tube and the plate supply voltage source, second resistance means connected between said zener diode and the plate supply voltage source, third resistance means connected between the plate of said triode tube and the plate supply voltage source, and means for supplying to the screen grid of said pentode amplifier tube first and second bias voltages, said first bias voltage having a fixed value and said second bias voltage having a value responsive to fluctuations in the plate supply voltage, said screen grid bias voltages in combination being consistent with the gam stability voltage gradient characteristics of said pentode amplifier tube, said screen grid bias voltages and said first resistance means having values adapted to effect starved current operation of said pentode.

3. A direct coupled amplifier as defined in claim 2 wherein said gain stability voltage gradient characteristics of said pentode amplifier tube are represented by $$\frac{\Delta E_{\text{screen}}}{\Delta E_{\text{plate supply}}}$$

means for supplying first and second bias voltages comprise a screen grid divider having fourth resistive means connected between said screen grid and the plate supply voltage source and fifth resistance means and a zener diode connected in series relationship between said screen grid and ground, and said fourth and fifth resistance means bear the relationship $$\frac{\text{fifth resistance means}}{\text{fourth resistance means}+\text{fifth resistance means}}$$

to each other and to said gain stability voltage gradient characteristics of said pentode amplifier tube.

4. A stable high gain amplifier comprising a plate supply voltage source, a pentode amplifier tube input stage connected between said plate supply voltage source and ground, a plate resistance having a value in the order of megohms between the plate of said pentode and said plate supply voltage source, and screen grid bias voltage supply means comprising a first resistance means connected between said plate supply voltage source and the screen grid of said pentode amplifier tube and a second resistance means and a constant voltage source respectively connected in series between said screen grid and ground, said screen grid voltage supply means providing a bias voltage that is consistent with the gain stability voltage gradient characteristics of said pentode amplifier tube and that is in the order of one tenth of the plate supply voltage, said gain stability voltage gradient characteristics of said pentode amplifier tube being represented by $$\frac{\Delta E_{\text{screen}}}{\Delta E_{\text{plate supply}}}$$

and said first and second resistance means having the relationship $$\frac{\text{second resistance means}}{\text{second resistance means}+\text{first resistance means}}$$

to each other and to said gain stability voltage gradient characteristics of said pentode amplifier tube.

5. The combination of a starved current amplifier and stabilizing means for stabilizing the gain thereof for fluctuations in plate supply voltage, said starved current amplifier including a pentode having a control grid for receiving an input signal and a screen grid, and said stabilizing means comprising a voltage dividing circuit connected to the screen grid of said pentode, said voltage dividing circuit comprising a first resistance means connected between said screen grid and the plate supply voltage source, and a constant voltage source and a second resistance means connected in series between said screen grid and the cathode of said pentode, said pentode having a gain stability voltage gradient characteristic represented by $$\frac{\Delta E_{\text{screen}}}{\Delta E_{\text{plate supply}}}$$

at substantially maximum gain, and said first and second resistance means having relative values adapted to establish a screen grid bias voltage which responds to plate supply voltage fluctuation in accordance with said gain stability voltage gradient characteristic.

6. A stable high gain starvation amplifier comprising a plate supply voltage source, a pentode amplifier tube, said pentode amplifier tube including a control grid for receiving an input signal and a screen grid and having a gain stability voltage gradient characteristic represented by $$\frac{\Delta E_{\text{screen}}}{\Delta E_{\text{plate supply}}}$$

at substantially maximum pentode gain, and means for establishing on said screen grid a bias voltage which responds to plate supply voltage fluctuations in accordance with said gain stability voltage gradient characteristic.

References Cited by the Examiner

UNITED STATES PATENTS

| | | | |
|---|---|---|---|
| 2,499,443 | 3/1950 | Young et al. | 330—128 |
| 3,167,717 | 1/1965 | Jones et al. | 328—58 X |

FOREIGN PATENTS

| | | |
|---|---|---|
| 257,046 | 3/1949 | Switzerland. |

OTHER REFERENCES

Shaughnessy; "The Zener Diode," Popular Electronics, June 1961; pp. 76–82.

ROY LAKE, *Primary Examiner.*

F. D. PARIS, R. P. KANANEN, N. KAUFMAN, *Assistant Examiners.*